(12) United States Patent
Li

(10) Patent No.: US 7,981,771 B2
(45) Date of Patent: Jul. 19, 2011

(54) STRUCTURES AND METHODS TO ENHANCE CU INTERCONNECT ELECTROMIGRATION (EM) PERFORMANCE

(75) Inventor: Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 12/132,806

(22) Filed: Jun. 4, 2008

(65) Prior Publication Data

US 2009/0302476 A1 Dec. 10, 2009

(51) Int. Cl.
*H01L 21/326* (2006.01)

(52) U.S. Cl. .... 438/468; 438/618; 438/927; 257/E23.17

(58) Field of Classification Search .................. 438/468, 438/618, 622, 637, 638, 641, 687, 927, 957; 257/E23.17, E23.174, E23.175
See application file for complete search history.

(56) References Cited

U.S. PATENT DOCUMENTS

| | | | |
|---|---|---|---|
| 5,712,510 A | 1/1998 | Bui et al. | |
| 5,900,735 A | 5/1999 | Yamamoto | |
| 6,191,481 B1 | 2/2001 | Bothra et al. | |
| 6,288,450 B1 | 9/2001 | Narita et al. | |
| 6,320,262 B1 | 11/2001 | Murakami | |
| 6,459,153 B1 | 10/2002 | Sengupta | |
| 6,552,434 B2 | 4/2003 | Hasunuma et al. | |
| 6,825,671 B1 | 11/2004 | Zhang | |
| 7,251,799 B2 * | 7/2007 | Nogami et al. | 716/122 |
| 7,671,444 B2 * | 3/2010 | Wang et al. | 257/529 |
| 7,737,528 B2 * | 6/2010 | Bonilla et al. | 257/529 |
| 2004/0061237 A1 | 4/2004 | Zhao et al. | |
| 2004/0166665 A1 * | 8/2004 | Gaillard et al. | 438/622 |
| 2004/0207092 A1 * | 10/2004 | Burrell et al. | 257/758 |
| 2007/0138511 A1 | 6/2007 | Oates et al. | |
| 2007/0284662 A1 * | 12/2007 | Chinthakindi et al. | 257/350 |
| 2008/0017989 A1 * | 1/2008 | Lee et al. | 257/758 |
| 2009/0014884 A1 * | 1/2009 | Li | 257/767 |

OTHER PUBLICATIONS

E. Todd Ryan et al. ,"Line Resistance and Electromigration Variations Induced by Hydrogen-Based Plasma Modifications to the Silicon Carbonitride/Copper Interface", May 14, 2007, Journal of the Electrochemical Society Issue 154, pp. H604-H610.*

* cited by examiner

*Primary Examiner* — Steven Loke
*Assistant Examiner* — Daniel Whalen
(74) *Attorney, Agent, or Firm* — Richard Kotulak; Roberts Mlotkowski Safran & Cole, P.C.

(57) ABSTRACT

The invention generally relates to semiconductor devices, and more particularly to structures and methods for enhancing electromigration (EM) performance in interconnects. A method includes forming an interconnect, forming a cap on the interconnect, and forming a plurality of holes in the cap to improve electromigration performance of the interconnect.

18 Claims, 5 Drawing Sheets

STRUCTURES AND METHODS TO ENHANCE CU INTERCONNECT ELECTROMIGRATION (EM) PERFORMANCE

FIELD OF THE INVENTION

The invention generally relates to semiconductor devices, and more particularly to structures and methods for enhancing electromigration (EM) performance in interconnects.

BACKGROUND

Integrated circuits conventionally comprise a substrate, semiconductor devices, and wiring (e.g., metallization) layers formed above the semiconductor devices. The wiring layers comprise various interconnects that provide electrical connections between the devices and external connections.

As interconnect dimensions continue to shrink (e.g., to create smaller devices), and with the adoption of ultra low k interlevel dielectric (ILD) material (e.g., for faster devices), the maximum allowed current density decreases rapidly due to electromigration (EM) effects. Electromigration is a well known phenomena in which, generally speaking, atoms of the interconnect material (e.g., copper) are displaced due to the electrical current passing through the interconnect. The migration of atoms can result in voids in the interconnect, which can increase electrical resistance or cause failure of the interconnect, both of which negatively impact reliability of the integrated circuit.

On the other hand, the desired higher speeds of circuits, use of high k materials, and use of ultra thin gate dielectric requires interconnects to carry higher currents. To meet the demands for higher currents, structures and techniques are needed to enhance interconnect EM performance.

One conventional method to enhance Cu interconnect EM performance is to strengthen the bond at the Cu/cap interface. For example, a capping layer (e.g., cap) is commonly provided between an interconnect and the next wiring level (e.g., ILD) to protect the Cu interconnect from oxidation and to enhance adhesion between the interconnect and the ILD of the next wiring level. The cap is generally a universal cap that covers all of the interconnect structures of a particular wiring level.

A method for strengthening the bond at the Cu/cap interface includes cleaning the entire upper surface of all interconnects of a wiring level with $H_2$ prior to depositing the cap material for that wiring level. The cleaning provides better bond between the Cu and the cap, which improves EM performance of the Cu, but significantly increases the electrical resistance of each interconnect.

Another method for strengthening the bond between the interconnect and the cap is to use alloys (e.g., copper and aluminum) as the material of the interconnect. The use of an alloy slows any EM diffusion in the interconnect, but unacceptably increases the electrical resistance of the interconnect.

An even further method for strengthening the bond between the interconnect and the cap is to use a universal metal cap, such as, for example, a cobalt-tungsten-phosphor (CoWP) cap, over all of the interconnects of a respective wiring level. The universal metal cap creates a strong bond with the Cu of the interconnect, but is very difficult to manufacture. For example, since the universal metal cap covers an entire wiring level, it is difficult to accurately control the thickness of the metal cap. In areas where the metal cap is too thin, it is not effective for EM improvement. In areas where the metal cap is too thick, there are problems with shorting (e.g., with neighboring lines) and with time dependent dielectric breakdown (TDDB).

All of the above-described methods utilize a blanket (e.g., universal) modification in which all of the cap and/or all of the interconnects of a particular wiring level are modified in some form. However, these one-size-fits-all approaches are inefficient in that they unnecessarily increase the electrical resistance of the interconnects and/or are difficult to manufacture.

Accordingly, there exists a need in the art to overcome the deficiencies and limitations described hereinabove.

SUMMARY

In a first aspect of the invention, there is a method for forming a semiconductor structure. The method includes forming an interconnect, forming a cap on the interconnect, and forming a plurality of holes in the cap to improve electromigration performance of the interconnect.

In another aspect of the invention, there is a semiconductor structure comprising an interconnect, a cap arranged on an upper surface of the interconnect, and a plurality of electromigration blocks formed in the cap. Each of the plurality of electromigration blocks comprises a hole extending through the cap to the upper surface of the interconnect, and the plurality of electromigration blocks divides the interconnect into segments that are each shorter in length than a Blech length of the interconnect.

In another aspect of the invention, there is a method of forming a semiconductor structure. The method includes forming an interconnect, and forming a cap layer on a top surface of the interconnect. The method also includes selectively removing a plurality of portions of the cap layer at discrete locations along the top surface of the interconnect spaced apart at a length that is less than a Blech length of the interconnect. The method further includes bonding a material to the top surface of the interconnect at the discrete locations.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor devices, and more particularly to structures and methods for enhancing electromigration (EM) performance in interconnects. In embodiments, the interface between a cap and an interconnect is modified in a local manner, instead of in a blanket or universal manner. By combining the localized interface modifications with the Blech effect, EM performance of the interconnect is improved while any accompanying increase in electrical resistance is minimized.

Figure 1:
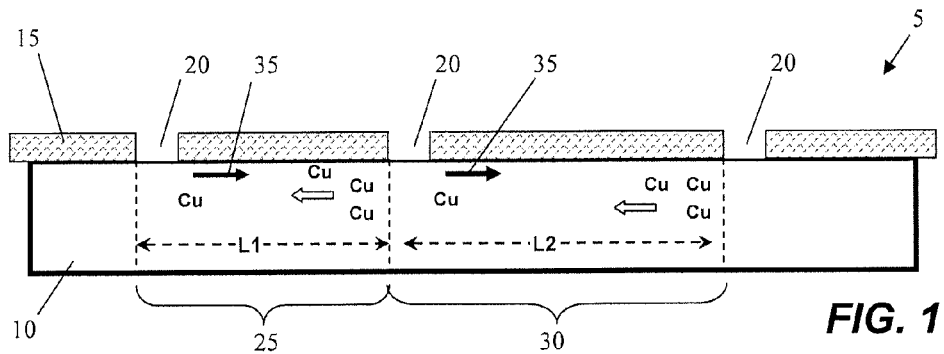
FIG. 1 shows a cross-sectional view of a semiconductor structure according to aspects of the invention.

FIG. 1 shows a cross-sectional view of an exemplary semiconductor structure 5 according to aspects of the invention. The structure 5 includes an interconnect 10 and a capping layer (e.g., cap) 15, which are formed, for example, in a wiring level of an integrated circuit (IC) device. The interconnect 10 and cap 15 may be formed using conventional techniques, such that further explanation is not believed necessary. Although the interconnect 10 is described herein as being copper (Cu), it is understood that other materials besides or in addition to Cu may be used for the interconnect 10. The cap 15 may comprise any suitable capping layer material, such as, for example, doped silicon carbide, silicon nitride, low-k materials, etc. Moreover, the thickness (e.g., height) of the interconnect 10 and cap 15 may be made to any suitable dimension, based, for example, on the design of the IC.

In embodiments of the invention, electromigration (EM) blocks 20 are formed in the cap 15. In embodiments, the EM blocks 20 comprise gaps formed through the entire depth of the cap 15 down to the surface of the interconnect 10. As discussed in greater detail below, the gaps may optionally be filled with additional material(s) after additional processing steps.

As depicted in FIG. 1, according to aspects of the invention, the EM blocks 20 are spaced apart along the interconnect 10 such that segments of the interconnect 10 defined between the EM blocks 20 have a length that is less than the Blech length for the interconnect 10. As is known, such that further explanation is not believed necessary, voids caused by electromigration will not occur in a metal line (e.g., interconnect) that is shorter than the Blech length for that particular line. Accordingly, in embodiments, interconnect first segment 25 has a length of L1 and interconnect second segment 30 has a length of L2, and each of L1 and L2 is less than the Blech length. More specifically, in a particular exemplary implementation, L1 and L2 are about 3 to 4 μm. However, the invention is not limited to such spacing, and the EM blocks 20 may be located to create any desired L1 and L2 based upon the Blech length of the interconnect 10.

By locating the EM blocks 20 near a critical Cu diffusion path 35, and by spacing the EM blocks 20 based upon the Blech length of the interconnect 10, implementations of the invention effectively improve EM performance of the interconnect 10 by suppressing long range copper diffusion in the interconnect 10. Moreover, the use of EM blocks 20 according to aspects of the invention allows for localized modification of discrete locations of the cap 15, without requiring process steps that affect the entirety of the cap 15.

Figure 2:
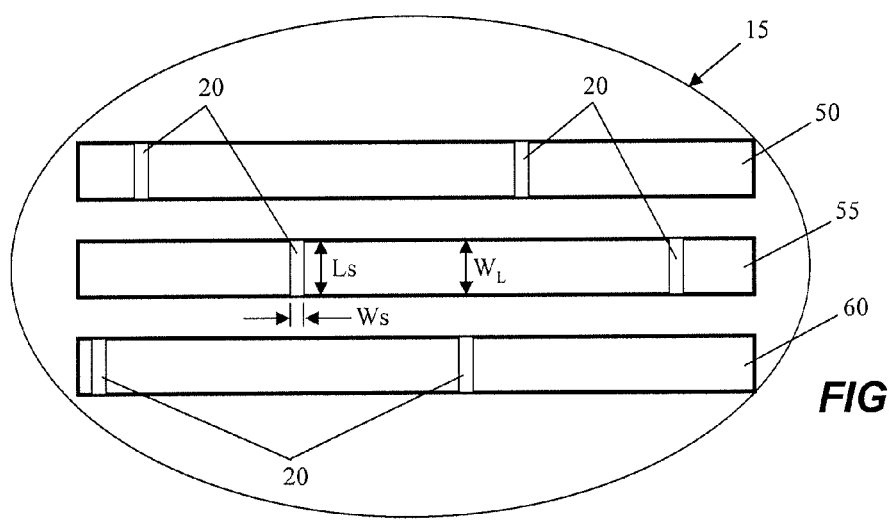
FIGS. 2 and 3 show top down views of semiconductor structures according to aspects of the invention.
Figure 3:
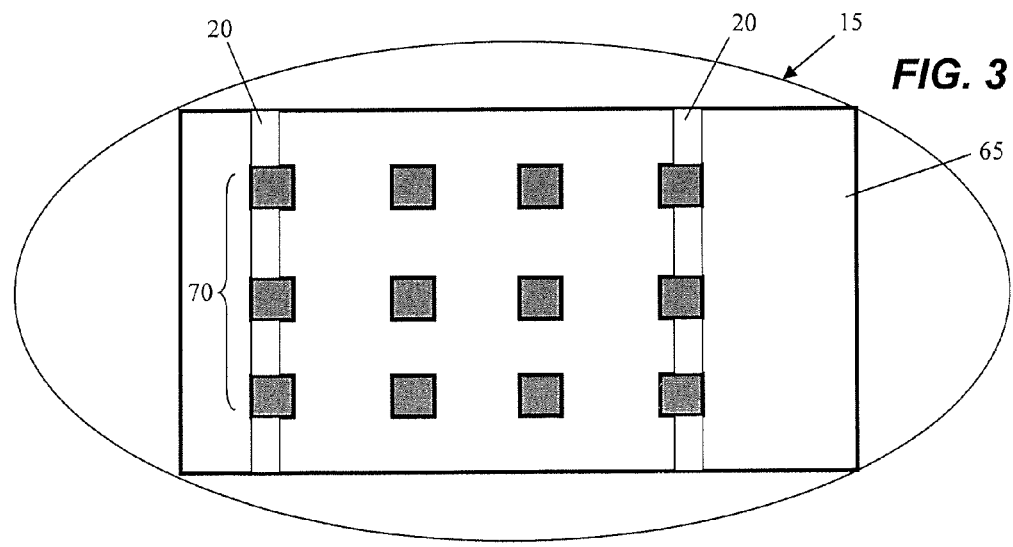

FIGS. 2 and 3 show top down views of semiconductor structures according to aspects of the invention. More specifically, FIG. 2 shows a plan view of three relatively thin, tight-pitch lines 50, 55, 60. The lines 50, 55, 60 may be similar to interconnect 10 described with respect to FIG. 1, with a universal cap 15 disposed atop all of the lines 50, 55, 60. EM blocks 20 are formed in the cap 15 in a localized manner over each line 50, 55, 60.

As depicted in FIG. 2, the EM blocks 20 constitute stripes in the cap 15, where the length $L_S$ of each stripe is equal to or greater than the width $W_L$ of the line 50, 55, 60 below. Also, in embodiments, the width $W_S$ of each stripe is equal to or greater than the minimum line width for the design. While the width $W_S$ of each stripe may be any desired width, too great of a width will increase the Cu resistance. Accordingly, in embodiments, the width $W_S$ of each stripe is substantially the same as the via size for the given technology.

Still referring to FIG. 2, the EM blocks 20 of adjacent lines 50, 55 and 55, 60 may be staggered (e.g., spatially offset) along the length of the lines. This avoids shorting and allows a wider process window. However, the invention is not limited to staggered EM blocks 20, and any sizing and location of EM blocks 20 may be used within the scope of the invention. For example, EM blocks 20 of adjacent lines may be aligned with each other.

FIG. 3 shows a wide line 65 with a cap 15 disposed atop the line 65. The line 65 and cap 15 may be similar to interconnect 10 and cap 15 described with respect to FIG. 1, with EM blocks 20 formed in the cap 15. In embodiments, line 65 includes holes 70 which are used to avoid dishing during chemical mechanical polishing (CMP). In particular embodiments, the EM blocks 20 may be aligned with the holes 70, which reduces processing impact on the material (e.g., Cu) of the line 65.

Figure 4:
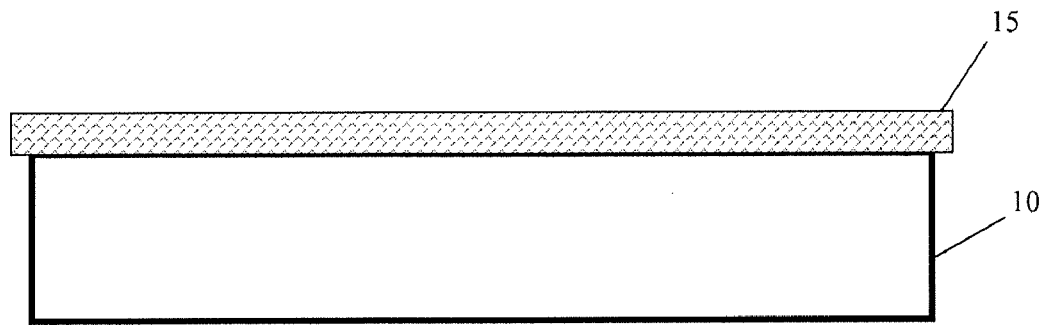
FIGS. 4-11 show steps of a process for fabricating semiconductor device structures according to aspects of the invention.
Figure 5:
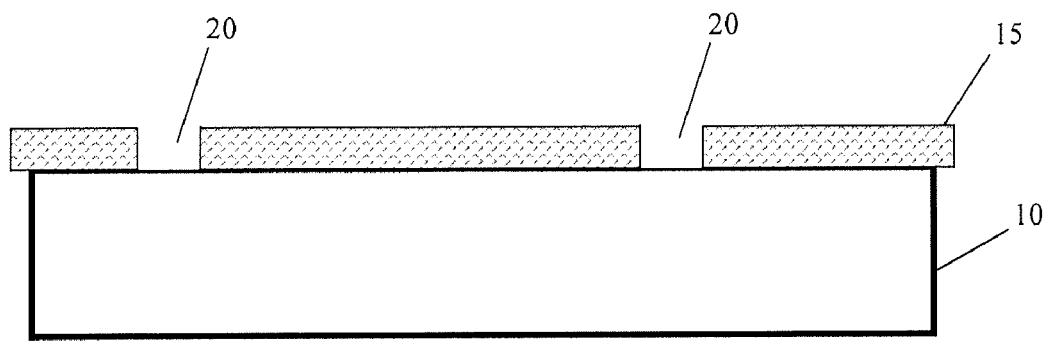

FIGS. 4 and 5 show steps of a process for fabricating semiconductor devices according to aspects of the invention. More specifically, FIG. 4 shows an interconnect 10 and a cap 15 formed using conventional processes, such as well known deposition processes (e.g., similar to that described with respect to FIG. 1). In embodiments, the interconnect comprises Cu and the cap 15 comprises one of doped silicon carbide, silicon nitride, and low-k materials, although the invention is not limited to these materials. FIG. 5 shows an intermediate structure in which EM blocks 20 are formed in the cap 15 by selectively removing portions of the material of the cap 15. For example, a conventional mask and etch process (e.g., reactive ion etching (RIE)) may be used to create the EM blocks 20 in the cap 15.

Figure 6:
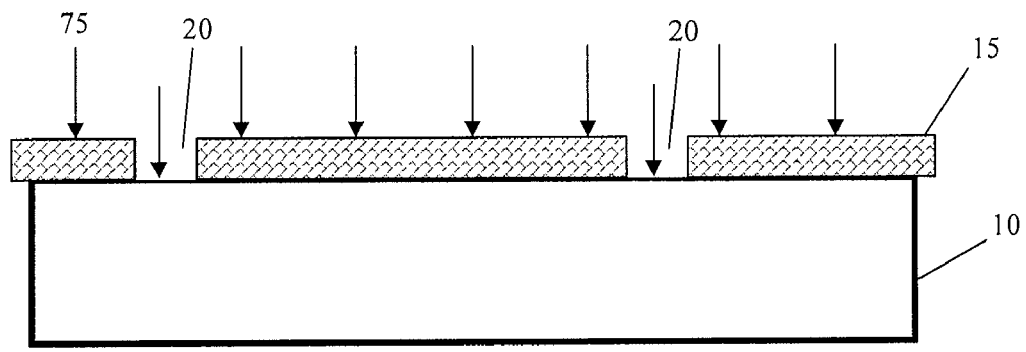
Figure 7:
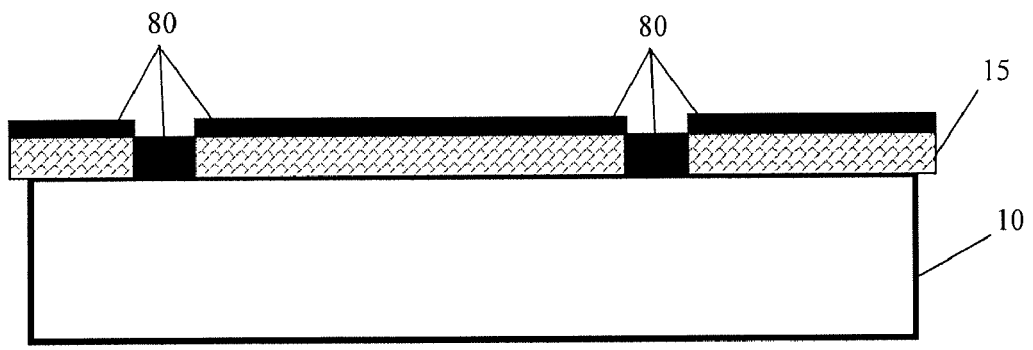

FIGS. 6 and 7 show steps of a process for fabricating a first aspect of a semiconductor device according to aspects of the invention, in which a local cleaning of the interconnect surface is performed at the EM blocks. Starting with the intermediate structure shown in FIG. 5, a cleaning step 75 is performed at FIG. 6 on the exposed portions of the cap 15 and interconnect 10. For example, the cleaning may be an ion bombardment cleaning in which ions (e.g., $H_2$) are impacted on the exposed surfaces of the cap 15 and interconnect 10. In this manner, the cleaning step only cleans the portions of the interconnect 10 that are exposed by the EM blocks 20, and not the entire upper surface of the interconnect. Accordingly, the cleaning further improves EM performance of the interconnect 10, without greatly increasing the electrical resistance of the interconnect 10 as a whole.

FIG. 7 shows that another capping layer 80 may be formed on the exposed surfaces of the cap 15 and interconnect 10. The other capping layer 80 may comprise, for example, the same material as the cap 15, or may be composed of a different material. Subsequent processing of the IC device may then be performed (e.g., the next wiring level may be deposited on the other capping layer, etc.).

Figure 8:
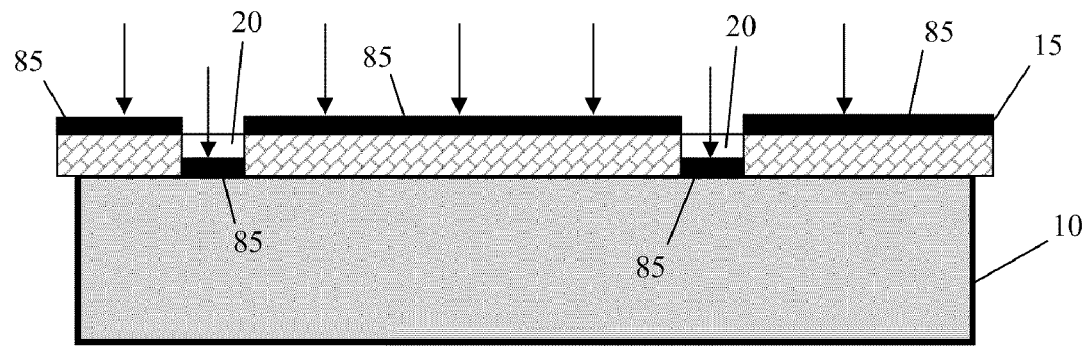
Figure 9:
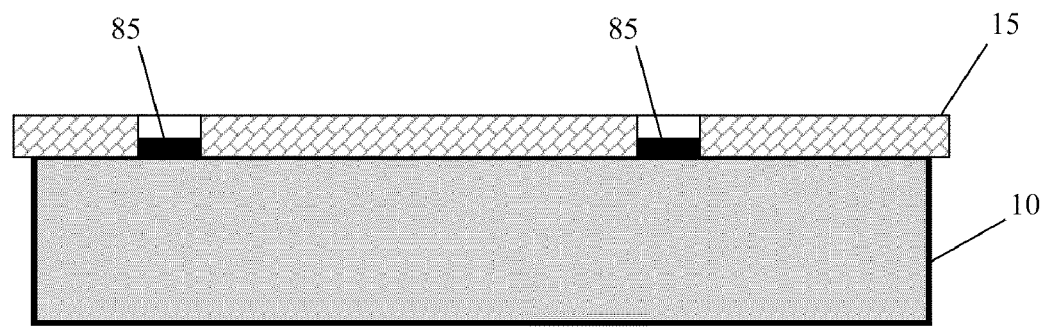

FIGS. 8 and 9 show steps of a process for fabricating a second aspect of a semiconductor device according to aspects of the invention, in which a metal capping layer is utilized on the exposed portions of the interconnect 10 in the EM blocks 20. Starting with the intermediate structure shown in FIG. 5, a metal layer 85 is deposited on the exposed surfaces of the cap 15 and interconnect 10, as shown in FIG. 8. The metal layer 85 may comprise any suitable metal material for forming a strong interface with the material of the interconnect. For example, the metal layer 85 may comprise an aluminum layer that is deposited by a sputtering process.

In FIG. 9, the portions of the metal layer 85 on the cap 15 are removed using any suitable process, such as, for example, RIE, CMP, etc., leaving intact the portions of the metal layer 85 inside the EM blocks 20 on the surface of the interconnect 10. In this manner, the remaining portions of the metal layer 85 form a strong interface with the material of the interconnect 10, thereby further reducing the likelihood of diffusion by electromigration (EM). Electrical resistance of the interconnect 10 is not significantly increased by the localized alloying of the metal layer 85 and interconnect 10 since only a small portion of the total interconnect undergoes such alloying. Furthermore, electromigration effects in the metal layer 85 are not significant, as the metal layer 85 does not carry any significant amount of current.

After FIG. 9, conventional processing of the IC device may be performed (e.g., the next wiring level may be deposited on the other capping layer, etc.). Optionally, prior to the subsequent processing, another capping layer (not shown, but similar to FIG. 7) may be added on the exposed portions of the device. The other capping layer may comprise, for example, the same material as the cap 15, or may be composed of a different material.

Figure 10:
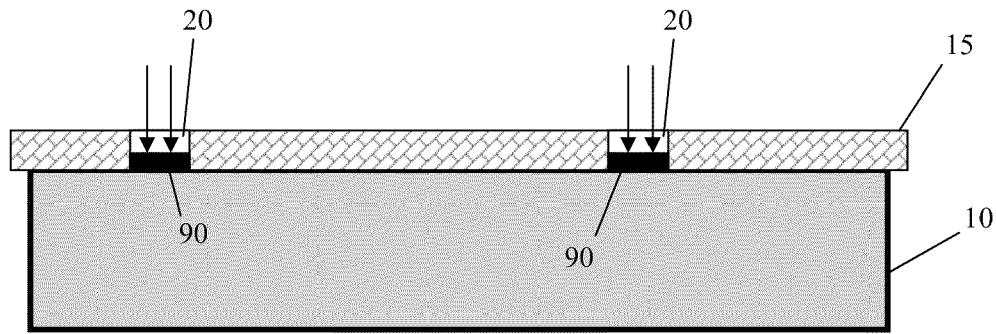
Figure 11:
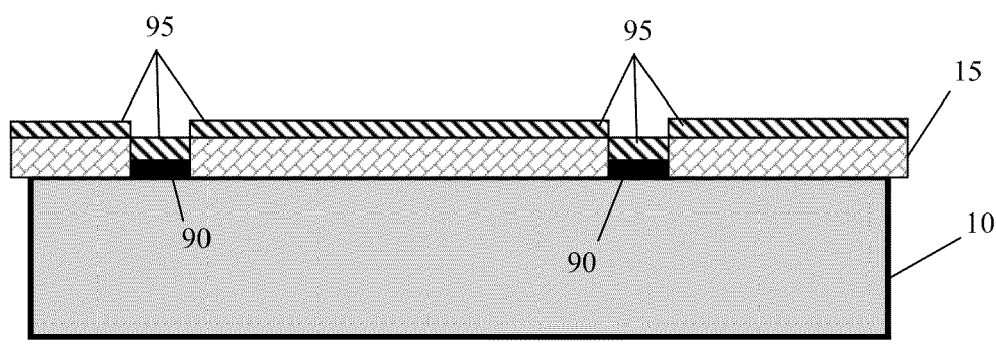

FIGS. 10 and 11 show steps of a process for fabricating another aspect of a semiconductor device according to aspects of the invention, in which a selective deposition is utilized on the exposed portions of the interconnect 10 in the EM blocks 20. Starting with the intermediate structure shown in FIG. 5, a selective deposition of metal/alloy material 90 is performed as shown in FIG. 10. The selective deposition forms metal or alloy (e.g., metal/alloy material 90) on the exposed surfaces of the interconnect 10 within the EM blocks 20, but not on the upper surface of the cap 15. In embodiments, the metal/alloy 90 comprises a cobalt-tungsten-phosphor (CoWP) alloy, although the invention is not limited to this material and any suitable material may be used in the selective deposition process. Optionally, as shown in FIG. 11, prior to the subsequent processing, another capping layer 95 may be added on the exposed portions of the device. The other capping layer 95 may comprise, for example, the same material as the cap 15, or may be composed of a different material. After FIG. 10 (or FIG. 11 if the optional capping layer 95 is utilized), conventional processing of the IC device may be performed (e.g., the next wiring level may be deposited on the other capping layer, etc.).

According to aspects of the invention, the metal/alloy 90 forms a strong interface with the material of the interconnect 10, thereby further reducing the likelihood of diffusion of the interconnect 10 by elcetromigration (EM). Electrical resistance of the interconnect 10 is not significantly increased by the localized alloying of the metal/alloy 90 and interconnect since only a small portion of the total interconnect 10 undergoes such alloying. Furthermore, electromigration effects in the metal layer 85 are not significant, as the metal layer 85 does not carry any significant amount of current. Moreover, CoWP caused time dependent dielectric breakdown (TDDB) is avoided since the EM blocks 20 are sufficiently far away from each other. Also, the relatively thick metal/alloy 90 is less demanding on thickness and uniformity control and is more tolerable to residues.

As demonstrated by the above-noted figures and description, implementations of the invention utilize EM blocks to effectively divide long interconnects into short segments to take advantage of the Blech effect, thereby improving the EM resistance of the interconnect. Moreover, the EM blocks may be added to the design after the design is substantially finalized. That is to say, the appropriate size and location of the EM blocks may be determined after the other features of the IC are finalized. For example, a finalized IC design could be input to a computing device (or software program operating on a computing device), and through appropriate programming the size and location of the EM blocks may be determined (e.g., by the computing device and/or programming) and automatically added to the IC design.

As implementations of the invention improve EM performance of the interconnect (e.g., slow long range Cu diffusion), it follows that implementations of the invention also improve stress migration performance of the interconnect. Moreover, embodiments of the invention may be used on any lines (interconnects, wires, etc.) for which there are electromigration (EM) and/or stress migration (SM) concerns. That is, the invention is not limited by upper level wiring.

Additionally, implementations of the invention reduce sensitivity to via bottom processing (e.g., gouging), since via gouging can be avoided by utilizing implementations of the invention. Furthermore, embodiments of the invention may be integrated with air gapping processes in which an air gap is purposefully left between the interconnect and the adjacent level of dielectric. Lastly, implementations of the invention provide options and flexibility on where to construct the EM blocks. For example, EM blocks may be excluded for low current lines and/or for short length (e.g., SRAM) lines where EM is not a great concern. In this manner, implementations of the invention promote process efficiency by allowing the designer to construct EM blocks only where necessary, in a localized manner.

Moreover, while the invention has been described with respect to a single level interconnect, the invention is not limited to such interconnects. For example, implementations of the invention may be used with interconnects that have multiple levels linked by vias, with aspects of the invention being applicable to any of the levels.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for forming a semiconductor structure, comprising:
 forming an interconnect;
 forming a cap on the interconnect;
 forming a plurality of holes in the cap, wherein the plurality of holes expose first and second portions of the interconnect and improve electromigration performance of the interconnect;
 cleaning the first and second portions of the interconnect exposed by the plurality of holes; and
 forming an additional cap layer directly on the first and second portions of the interconnect, wherein the additional cap layer comprises one of doped silicon carbide, silicon nitride, and low k material.

2. The method of claim 1, wherein the interconnect is composed of copper.

3. The method of claim 1, wherein the cap comprises one of: doped silicon carbide, silicon nitride, and low k material.

4. The method of claim 1, wherein the plurality of holes extend through the cap to an upper surface of the interconnect.

5. The method of claim 1, wherein a distance between two adjacent holes of the plurality of holes is less than a line length below which voids caused by electromigration will not occur.

6. The method of claim 1, wherein the cleaning comprises bombarding the first and second portions of the interconnect with $H_2$ ions.

7. The method of claim 1, wherein:
 each one of the plurality of holes comprises a stripe having a length in a width direction of the interconnect when viewed in a top down view;
 the length of each stripe is equal to or greater than the width of the interconnect when viewed in the top down view; and
 a width of each stripe is equal to or greater than a predetermined line width.

8. The method of claim 1, wherein:
 a distance between two adjacent holes of the plurality of holes is less than a predetermined length; and
 the predetermined length is a line length below which voids caused by electromigration will not occur.

9. The method of claim 1, wherein the interconnect comprises a wide wire having at least one anti-dishing hole, and at least one of the plurality of holes coincides with the at least one anti-dishing hole.

10. The method of claim 1, further comprising:
 forming a second interconnect having a second upper surface on which the cap is arranged; and
 forming second plurality of holes in the cap over the second interconnect,
 wherein the second plurality of holes are staggered in relation to the plurality of holes.

11. A method of forming a semiconductor structure, comprising:
 forming an interconnect;
 forming a cap layer on a top surface of the interconnect;
 selectively removing a plurality of portions of the cap layer at discrete locations along the top surface of the interconnect spaced apart at a length that is less than a predetermined length; and
 after selectively removing the plurality of portions of the cap layer, bonding a material to the top surface of the interconnect at the discrete locations, wherein the material comprises one of: doped silicon carbide, silicon nitride, and low k material.

12. The method of claim 11, wherein the predetermined length is a line length below which voids caused by electromigration will not occur.

13. The method of claim 11, wherein the selectively removing the plurality of portions of the cap layer exposes a plurality of portions of the interconnect, and further comprising cleaning the plurality of portions of the interconnect prior to the bonding the material to the top surface of the interconnect.

14. The method of claim 13, wherein the cleaning comprises bombarding the plurality of portions of the interconnect with $H_2$ ions.

15. The method of claim 14, wherein the cap layer and the material are composed of a same material.

16. A method of forming a semiconductor structure, comprising:
 forming an interconnect;
 forming a cap on an upper surface of the interconnect, wherein the cap comprises one of: doped silicon carbide, silicon nitride, and low k material;
 forming a plurality of electromigration blocks in the cap, wherein each of the plurality of electromigration blocks comprises a hole extending through the cap to the upper surface of the interconnect, and the plurality of electromigration blocks divides the interconnect into segments that are each shorter in length than a predetermined length;
 cleaning a plurality of portions of the interconnect that are exposed by the plurality of electromigration blocks in the cap; and
 forming an additional cap layer directly on the plurality of portions of the interconnect,
 wherein the forming the additional cap layer is performed after the cleaning, and
 the additional cap layer comprises a same material as the cap.

17. The method of claim 16, wherein the interconnect comprises a wide wire having at least one anti-dishing hole, and at least one of the plurality of electromigration blocks coincides with the at least one anti-dishing hole.

18. The method of claim 16, further comprising:
 forming a second interconnect having a second upper surface on which the cap is arranged; and
 forming second plurality of electromigration blocks in the cap over the second interconnect,
 wherein the second plurality of electromigration blocks are staggered in relation to the plurality of electromigration blocks.

* * * * *